US011781587B2

(12) United States Patent
Tachibana et al.

(10) Patent No.: US 11,781,587 B2
(45) Date of Patent: Oct. 10, 2023

(54) ENGAGED MEMBER, ENGAGING MEMBER, DETECTION DEVICE, DETECTION METHOD, AND DETECTION PROGRAM

(71) Applicant: NEC Platforms, Ltd., Kawasaki (JP)

(72) Inventors: Hideyuki Tachibana, Kanagawa (JP); Kunihiko Endoh, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 222 days.

(21) Appl. No.: 17/293,089

(22) PCT Filed: Nov. 6, 2019

(86) PCT No.: PCT/JP2019/043372
§ 371 (c)(1),
(2) Date: May 12, 2021

(87) PCT Pub. No.: WO2020/100668
PCT Pub. Date: May 22, 2020

(65) Prior Publication Data
US 2021/0404509 A1    Dec. 30, 2021

(30) Foreign Application Priority Data
Nov. 14, 2018    (JP) .................... 2018-213606

(51) Int. Cl.
*F16B 41/00*    (2006.01)
*F16B 31/02*    (2006.01)
(Continued)

(52) U.S. Cl.
CPC ............ *F16B 41/005* (2013.01); *G01R 27/02* (2013.01); *F16B 31/025* (2013.01); *G01L 5/00* (2013.01); *H01H 19/02* (2013.01)

(58) Field of Classification Search
CPC ........... G01R 27/00; G01R 27/02; G01L 5/00; F16B 41/00; F16B 41/005; F16B 31/00;
(Continued)

(56) References Cited

U.S. PATENT DOCUMENTS 4,151,506 A    4/1979 Schoenmetz
4,713,506 A    12/1987 Klink
(Continued)

FOREIGN PATENT DOCUMENTS

GB    2547958 A  *  9/2017    ............ H01R 13/02
JP    S48-056984 U    7/1973
(Continued)

OTHER PUBLICATIONS

International Search Report for PCT Application No. PCT/JP2019/043372, dated Dec. 3, 2019.
(Continued)

*Primary Examiner* — Hoai-An D. Nguyen

(57) ABSTRACT

To reduce the likelihood of erroneous detection resulting from improper engagement of an engaging part with an engaged part, a fixing member is made to have a recess formed therein and is provided with a plurality of conduction paths that are electrically insulated from each other and have portions that are exposed at a plurality of positions including a first position inside the recess and in the vicinity of the innermost part of the recess and a second position inside the recess and not in the vicinity of the innermost part of the recess and other portions that are exposed outside of the recess, and a prescribed member touching the first position and second position can push the area around the opening of the recess.

11 Claims, 17 Drawing Sheets

(51) Int. Cl.
G01R 27/02 (2006.01)
G01L 5/00 (2006.01)
H01H 19/02 (2006.01)

(58) Field of Classification Search
CPC ....... F16B 31/02; F16B 31/025; H01H 19/00; H01H 19/02
See application file for complete search history.

(56) References Cited

U.S. PATENT DOCUMENTS

| | | | |
|---|---|---|---|
| 6,809,508 B2 * | 10/2004 | Donofrio | H01H 9/04 |
| | | | 324/427 |
| 7,212,386 B1 * | 5/2007 | Finlay, Sr. | H01H 83/04 |
| | | | 361/42 |
| 9,899,757 B2 * | 2/2018 | Do | H01R 13/08 |

FOREIGN PATENT DOCUMENTS

| | | |
|---|---|---|
| JP | H02-024979 A | 1/1990 |
| JP | H07-279936 A | 10/1995 |
| JP | H07-280762 A | 10/1995 |
| JP | 2000-099186 A | 4/2000 |
| JP | 2000-231855 A | 8/2000 |

OTHER PUBLICATIONS

English translation of Written opinion for PCT Application No. PCT/JP2019/043372, dated Dec. 3, 2019.

* cited by examiner

ENGAGED MEMBER, ENGAGING MEMBER, DETECTION DEVICE, DETECTION METHOD, AND DETECTION PROGRAM

This application is a National Stage Entry of PCT/JP2019/043372 filed on Nov. 6, 2019, which claims priority from Japanese Patent Application 2018-213606 filed on Nov. 14, 2018, the contents of all of which are incorporated herein by reference, in their entirety.

TECHNICAL FIELD

The present invention relates to a method of detecting an improper engagement state.

BACKGROUND ART

A case of stealing a device such as a car navigation device for an automobile occurs frequently. When it can be detected that a screw or the like for fixing the device is loosened, for example, a detection result is reported to a user, a security company, or the like via a report system, which is expected to contribute to solving the case. Further, it is also expected that the theft may be prevented by issuing a warning sound in order to raise an attention.

In view of this, PTL 1 discloses a detection switch in which contact points that are closed by being fastened and clamped between a back surface of an equipment housing and a nut member are arranged in a vicinity of a periphery of a shaft of a screw member, in such a way as to face each other. In this structure, the contact points are opened when a loosely threaded relationship is established between the screw member and the nut member.

Further, PTL 2 discloses a looseness detection device in which a contact detection member including a conductive portion on which a nut abuts is fixed when the nut rotates relatively with respect to a bolt. The looseness detection device detects a conduction state by electrically connecting the conductive portion and the nut to each other.

Further, PTL 3 discloses a screw looseness detection device that is electrically connected to a conductive portion provided on a cap and a conductive portion provided on the female screw body and that detects a conductive state established by a contact between the conductive portions when a male screw body and the female screw body are loosened.

CITATION LIST

Patent Literature

[PTL 1] Japanese Unexamined Patent Application Publication No. 2000-231855
[PTL 2] Japanese Unexamined Patent Application Publication No. H07-280762
[PTL 3] Japanese Unexamined Patent Application Publication No. H07-279936

SUMMARY OF INVENTION

Technical Problem

In the method disclosed in PTL 1, the shaft of the screw member is inserted into the nut member, and a movable contact piece moves outward about the shaft in such a way as to contact a fixed contact piece, thereby turning on the switch. However, outward movement of the movable contact piece about the shaft, which is caused by insertion of the screw member into the nut member, is fine. Thus, it is difficult to set positions of both the contact pieces in such a way that both the contact pieces are away from each other when the shaft is not inserted and that both the contact pieces contact each other when the shaft is inserted. Thus, likelihood of erroneous looseness detection resulting from a case that both the contact pieces contact each other even when the shaft is not inserted, and the like, is high.

Further, in the methods disclosed in PTLs 2 and 3, a cap-shaped detection member is mounted on a shaft of the bolt protruding from the nut. However, even when threading of the bolt with the nut is not loosened, mounting of the detection member on the shaft is loosened, thereby the detection member contacts the nut in some cases, which may cause erroneous looseness detection.

An object of the present invention is to provide an engaged portion and the like capable of reducing the likelihood of erroneous detection resulting from improper engagement of an engaging portion with the engaged portion.

Solution to Problem

A fixing member according to the present invention includes a recessed portion formed therein, and a plurality of conduction paths being electrically insulated from each other, and including a part of each of the plurality of conduction paths that is exposed at a plurality of positions including a first position in an inside of the recessed portion and in a vicinity of an innermost part and a second position in the inside and in a part other than the vicinity of the innermost part, and another part that is exposed to an outside of the recessed portion, wherein a predetermined member that contacts the first position and the second position is able to press a periphery of an opening part of the recessed portion.

Advantageous Effects of Invention

The engaged portion and the like according to the present invention are capable of reducing the likelihood of erroneous detection resulting from improper engagement of the engaging portion with the engaged portion.

EXAMPLE EMBODIMENT

First Example Embodiment

A first example embodiment is an example embodiment relating to a detection device that detects looseness of a screw or the like, based on presence or absence of contact between a surface on a distal end of a shaft of the screw or the like and a terminal that is formed in a vicinity of an innermost part of a screw groove of a cap-nut shaped nut member or the like.

[Configuration and Operation]

Figure 1:
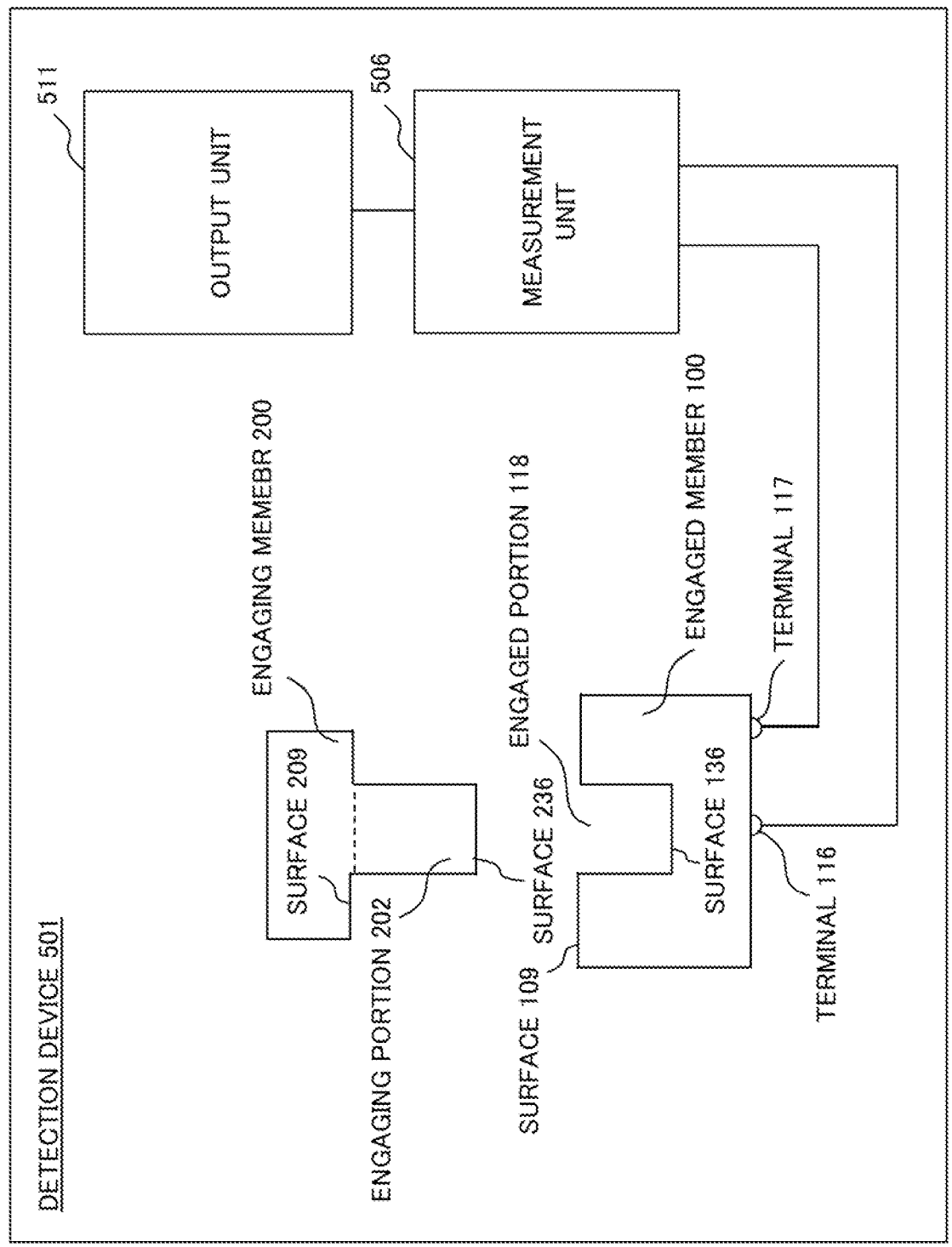
FIG. 1 is a schematic diagram illustrating a configuration example of a detection device according a first example embodiment.

FIG. 1 is a schematic diagram illustrating a configuration of a detection device 501 being one example of the detection device according to the first example embodiment.

The detection device 501 includes an engaged member 100, an engaging member 200, a measurement unit 506, and an output unit 511.

For example, the engaging member 200 is a screw. An engaging portion 202 is formed on the engaging member 200. When the engaging member 200 is a screw, the engaging portion 202 is a shaft of the screw. An Example of the engaging member being a screw is described later with reference to FIG. 3. The engaging member 200 includes a surface 209 for sandwiching an object by being engaged with the engaged member 100.

For example, the engaged member 100 is a cap-nut shaped nut member. An engaged portion 118 is formed in the engaged member 100. In a vicinity of an opening part of the engaged portion 118, the engaged member 100 includes a surface 109 for sandwiching an object by being engaged with the engaged member 200. An example of the engaged member 100 being a cap-nut shaped nut member is described later with reference to FIG. 2.

The engaging portion 202 can be engaged with the engaged portion 118. When the engaged member 100 is a cap-nut shaped nut member and the engaging member 200 is a screw, a screw ridge of the engaging portion 202 can be threaded with a screw groove of the engaged portion 118. An example of such a threading state is described later with reference to FIG. 4.

The engaged member 100 includes terminals 116 and 117. The terminal 116 and the terminal 117 are electrically connected to each other when the engagement causes a surface 136 and a surface 236 to contact each other directly, or indirectly through intermediation of another conductor.

The terminal 116 and the terminal 117 are electrically disconnected to each other in a case where, even when the engagement is established to some extent, the engagement is incomplete and the surface 136 and the surface 236 are not electrically connected to each other.

The measurement unit 506 measures a resistance value between the terminal 116 and the terminal 117. Further, when determining that the resistance value is equal to or greater than a threshold value, the measurement unit 506 transmits a predetermined notification signal to the output unit 511. The threshold value is a threshold value relating to the resistance value between the terminal 116 and the terminal 117, and is predetermined in order to determine whether or not the surface 136 and the surface 236 contact each other directly, or indirectly through intermediation of another conductor.

For example, the measurement unit 506 is a configuration including a computer. In such case, the computer executes the above-mentioned operation with a program or information stored in an unillustrated recording unit, for example.

When the notification signal is transmitted from the measurement unit 506, the output unit 511 performs output associated with the notification signal. For example, the output unit 511 is a sound source, a display unit, or an information transmission unit.

When the output unit 511 is a sound source, an output content is a warning sound, for example. For example, the warning sound is output for a person nearby.

When the output unit 511 is a display unit, an output content is emission of warning light. For example, the warning light is output for a person nearby.

When the output unit 511 is an information transmission unit, an output content is transmission of information indicating occurrence of abnormality, for example. For example, the transmission is performed to an owner or a person in charge of managing an object fixed with a nut member being the engaged member 200 and a screw being an engaging member. The object is a device such as a car navigation device for an automobile, which is given as an example in the section of Background Art.

Figure 2:
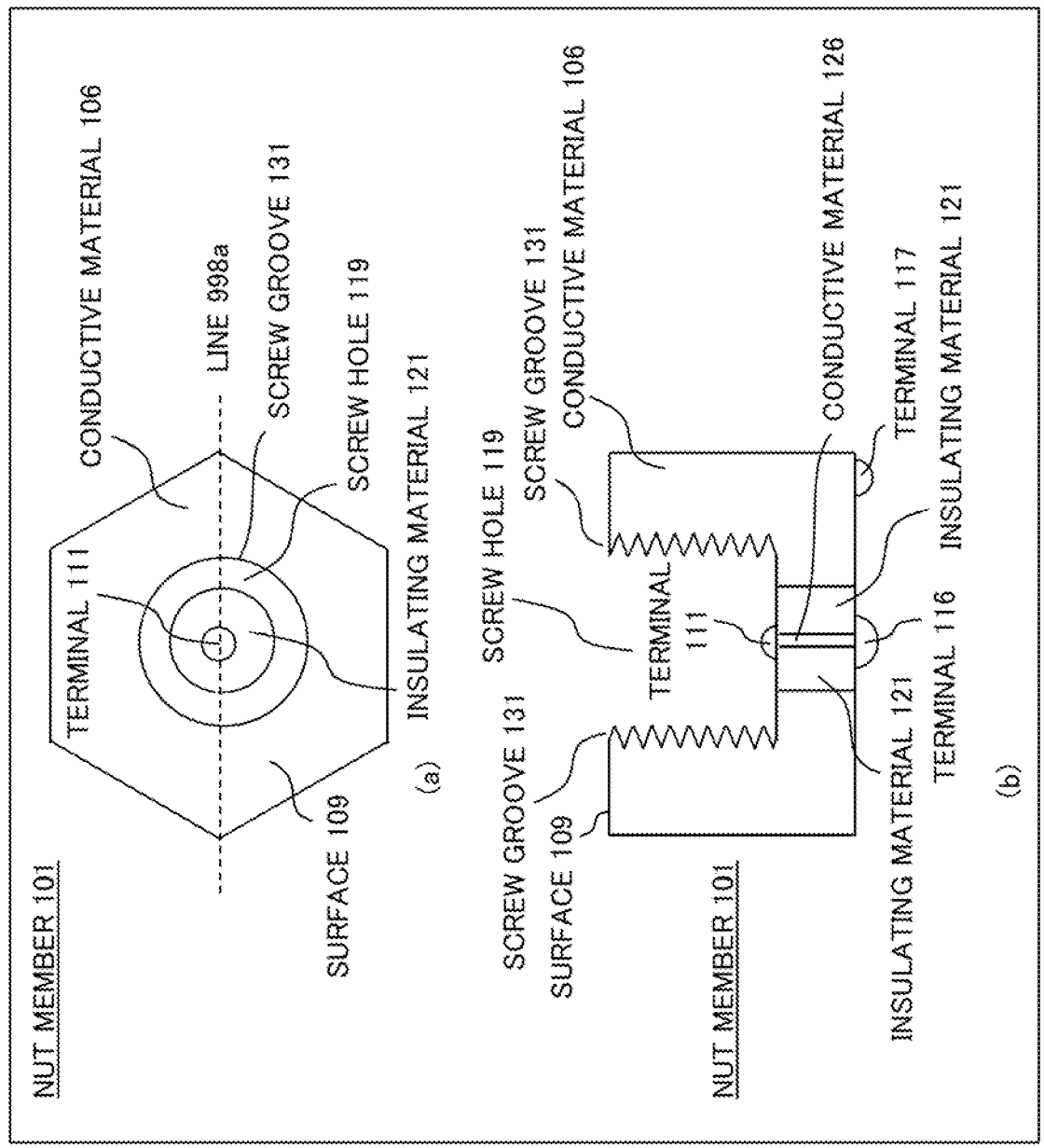
FIG. 2 is a schematic diagram illustrating a configuration example of a nut member being an engaged member.

FIG. 2 is a schematic diagram illustrating a configuration of a nut member 101 being an example of the engaged portion illustrated in FIG. 1. FIG. 2(a) is a top diagram, assuming that a part in which a screw hole of the nut member 101 is formed is viewed. FIG. 2 (b) is a cross-sectional diagram, assuming that the nut member 101 is cut along a line 998a illustrated in FIG. 2(a).

The nut member 101 has a cap-nut shape. Alternatively, the nut member 101 itself is a cap nut.

The nut member 101 includes a conductive material 106, an insulating material 121, a conductive material 126, the terminals 116 and 117, and a terminal 111. A screw hole 119 is formed in the nut member 101. A screw groove 131 is formed on a side surface of the conductive material 106 in a periphery of the screw hole 119.

In a vicinity of an opening part of the screw hole 119, the nut member 101 includes the surface 109 for sandwiching an object between the surface 109 and a cap of a screw by threading with a screw 201 described later with reference to FIG. 3.

The conductive material 106 is typically formed of metal.

The conductive material 126 electrically connects the terminal 111 and the terminal 116 to each other. Both the terminal 111 and the terminal 116 are formed of a conductive material such as metal. The conductive material 126 is also formed of metal, for example.

The terminals 116 and 117 are examples of the terminals 116 and 117 illustrated in FIG. 1. The terminal 117 is formed of a conductive material such as metal.

As illustrated in (b) of FIG. 2, the insulating material 121 is formed in such a way as to surround the conductive material 126. The conductive material 106 and the conductive material 126 are insulated from each other by the insulating material 121.

Note that a shape of the nut member 101 in the top diagram illustrated in FIG. 2(a) is a hexagonal shape, but the shape of the nut member according to the present example embodiment in the top diagram may be any shape.

Figure 3:
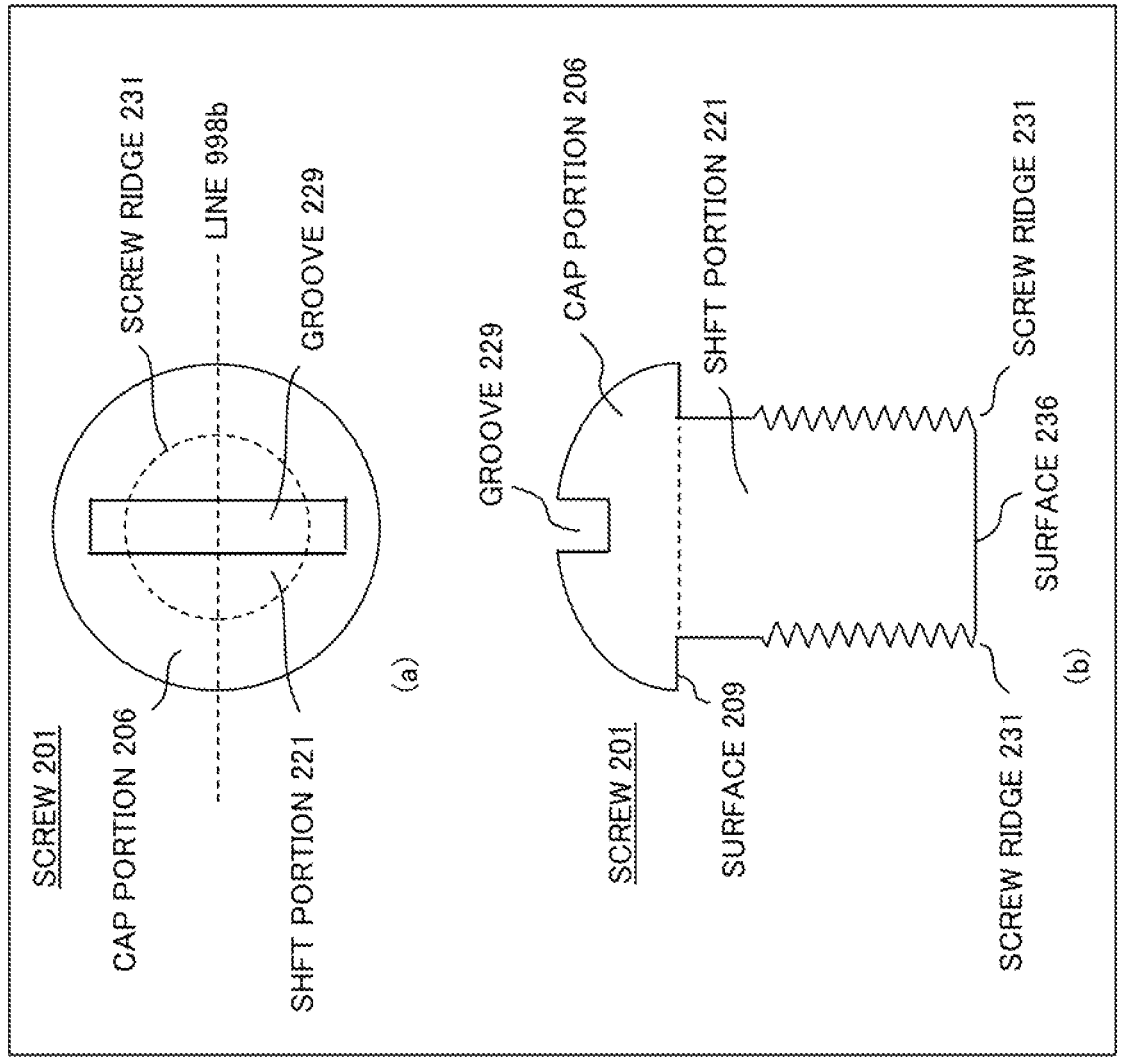
FIG. 3 is a schematic diagram illustrating a configuration example of a screw being an engaging member.

FIG. 3 is a schematic diagram illustrating a configuration of the screw 201 being an example of the engaging member 200 illustrated in FIG. 1. FIG. 3(a) is a top diagram, assuming that a part of the screw 201 in which a groove for screwdriver insertion is formed is viewed. Further, FIG. 3(b) is a cross-sectional diagram, assuming that the screw 201 is cut along a line 998b illustrated in FIG. 3(a).

For example, the screw 201 is a general screw.

The screw 201 includes the surface 209 for sandwiching an object between the surface 209 and the surface 109 illustrated in FIG. 2, through threading with the nut member 101 illustrated in FIG. 2.

The screw 201 includes a cap portion 206 and a shaft portion 221. The cap portion 206 and the shaft portion 221 may be formed integrally.

A screw ridge 231 is formed in a circumference of a lower part of the shaft portion 221. The shaft portion 221 can be inserted into the screw hole 119 illustrated in FIG. 2. The screw ridge 231 of the shaft portion 221 can be threaded with the screw groove 131 of the screw hole 119 illustrated in FIG. 2.

A groove 229 into which a tip of a screwdriver can be inserted is formed on the cap portion 206.

Note that the shape of the cap portion 206 is not limited to the shape illustrated in FIG. 3, and may be any shape. Further, the cap portion 206 may not be provided.

Figure 4:
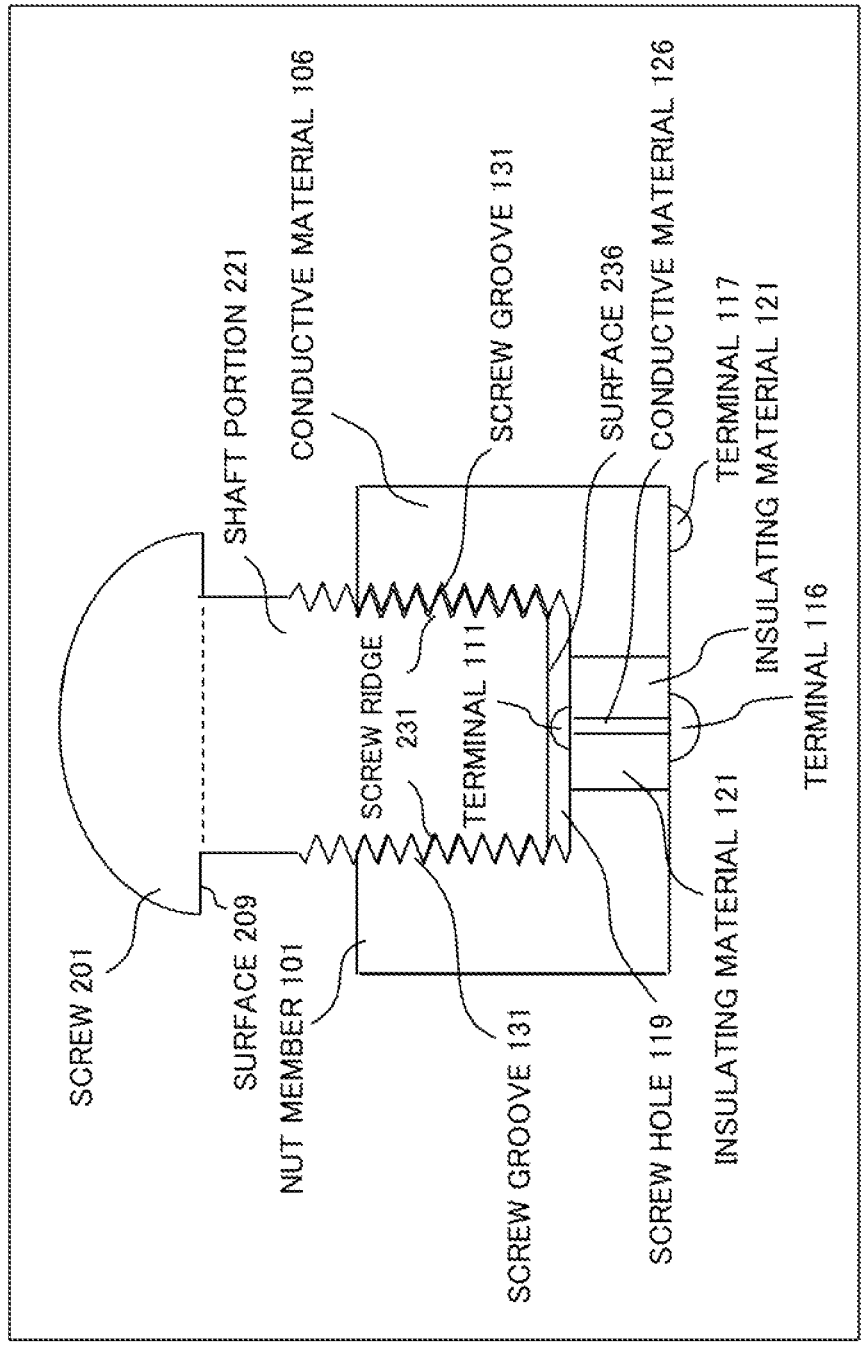
FIG. 4 is a schematic diagram illustrating a state in which a shaft portion of the screw is engaged with a screw hole of the nut member.

FIG. 4 is a schematic diagram illustrating a state in which the shaft portion 221 of the screw 201 illustrated in FIG. 3 is engaged with the screw hole 119 of the nut member 101 illustrated in FIG. 2. In FIG. 4, the groove 229 illustrated in FIG. 3 is omitted in illustration.

In the state illustrated in FIG. 4, the screw ridge 231 of the shaft portion 221 is threaded with a thread groove of the conductive material 106. Through the threading, the shaft portion 221 and the conductive material 106 are electrically connected to each other.

Further, the terminal 111 of the nut member 101 is electrically connected to the surface 236 of the shaft portion 221. Note that the surface 236 may be a recessed surface that surrounds the terminal 111 in such a way as to stabilize contact of the terminal 111.

With those structures, the terminal 116 is electrically connected to the terminal 117 through intermediation of the conductive material 126, the terminal 111, the shaft portion 221, and the conductive material 106.

In this state, when the terminals 116 and 117 are connected to the measurement unit 506 illustrated in FIG. 1, the measurement unit 506 detects that a resistance between the terminal 116 and the terminal 117 is equal to or less than the above-mentioned threshold value. The threshold value is a threshold value relating to the resistance value between the terminal 116 and the terminal 117, and is predetermined in order to determine whether or not the surface 136 and the surface 236 contact each other directly, or indirectly through intermediation of another conductor. A resistance between the terminal 116 and the terminal 117 being equal to or less than the threshold value indicates that a threading state of the screw 201 with the nut member 101 is normal.

Figure 5:
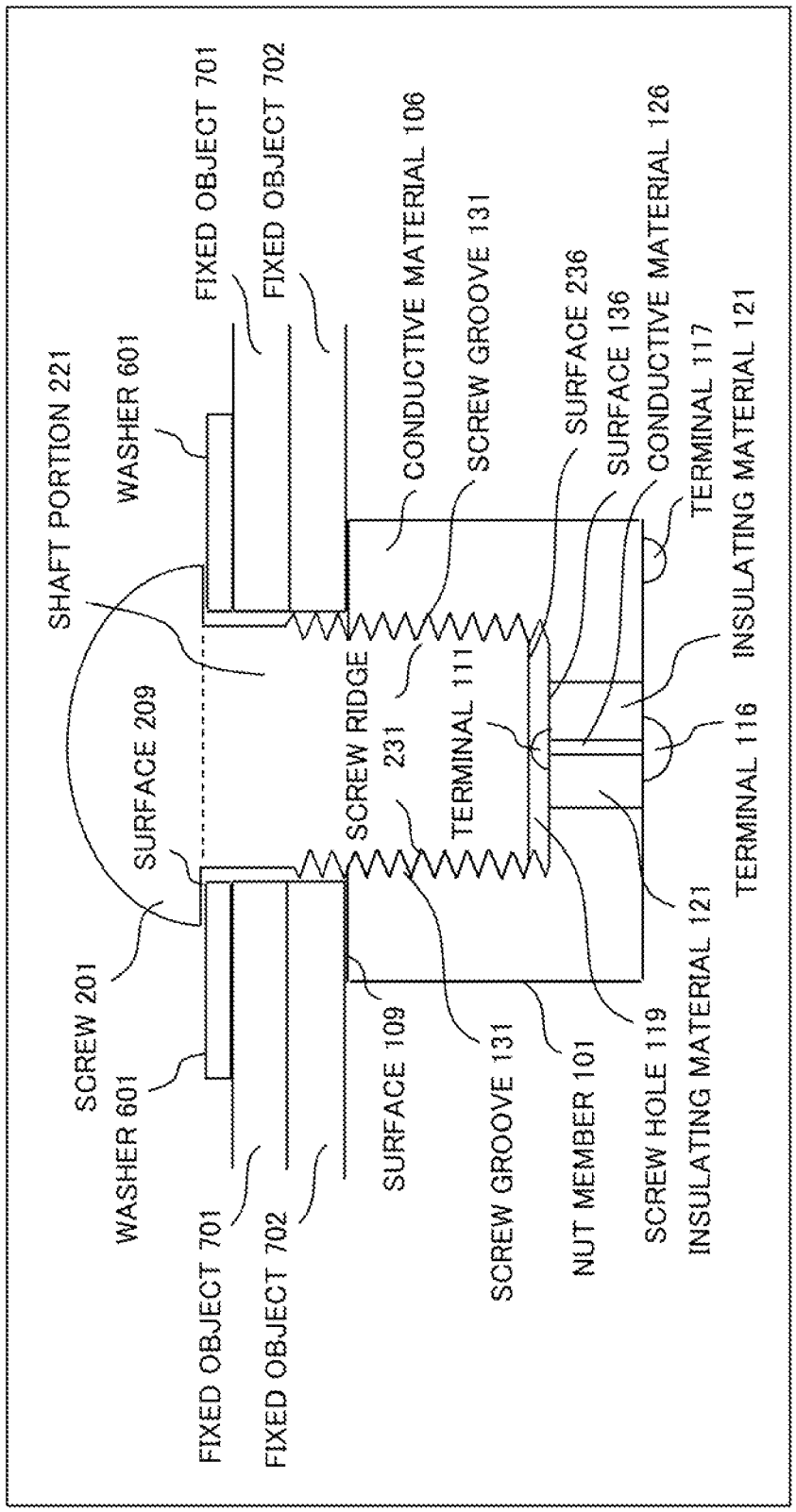
FIG. 5 is a schematic diagram illustrating a state in which an object is fixed with the nut member and the screw.

FIG. 5 is a schematic diagram illustrating a state of fixing an object with the nut member 101 illustrated in FIG. 2 and the screw 201 illustrated in FIG. 3. As described below, a method of fixing an object with the nut member 101 and the screw 201 is similar to a general method of fixing an object with a cap nut and a screw, except that the terminal 111 of the nut member 101 is brought into contact with a bottom surface of the screw 201.

Fixed objects 701 and 702 illustrated in FIG. 5 are target objects that are fixed to each other with the nut member 101 and the screw 201.

The shaft portion 221 of the screw 201 passes through a hole of a washer 601 and a hole formed in each of the fixed objects 701 and 702, and is inserted into the screw hole 119 of the nut member 101. Further, the screw 201 fastens the washer 601 and the fixed objects 701 and 702. In this state, the surface 236 of the shaft portion 221 of the screw 201 contacts the terminal 111 of the nut member 101. In the fastened state, the washer 601 has a function as an adjustment member for bringing the terminal 111 into contact with the surface 236.

With this structure, the terminal 111 of the nut member 101 is electrically connected to the shaft portion 221.

With those structures, the terminal 116 is electrically connected to the terminal 117 through intermediation of the conductive material 126, the terminal 111, the shaft portion 221, and the conductive material 106.

In the state illustrated in FIG. 5, when the terminals 116 and 117 are connected to the measurement unit 506 illustrated in FIG. 1, the measurement unit 506 detects that a resistance between the terminal 116 and the terminal 117 is equal to or less than the above-mentioned threshold value. The threshold value is a threshold value relating to the resistance value between the terminal 116 and the terminal 117, and is predetermined in order to determine whether or not the surface 136 and the surface 236 contact each other directly, or indirectly through intermediation of another conductor. A resistance between the terminal 116 and the terminal 117 being equal to or less than the threshold value indicates that a threading state of the screw 201 with the nut member 101 is normal.

Figure 6:
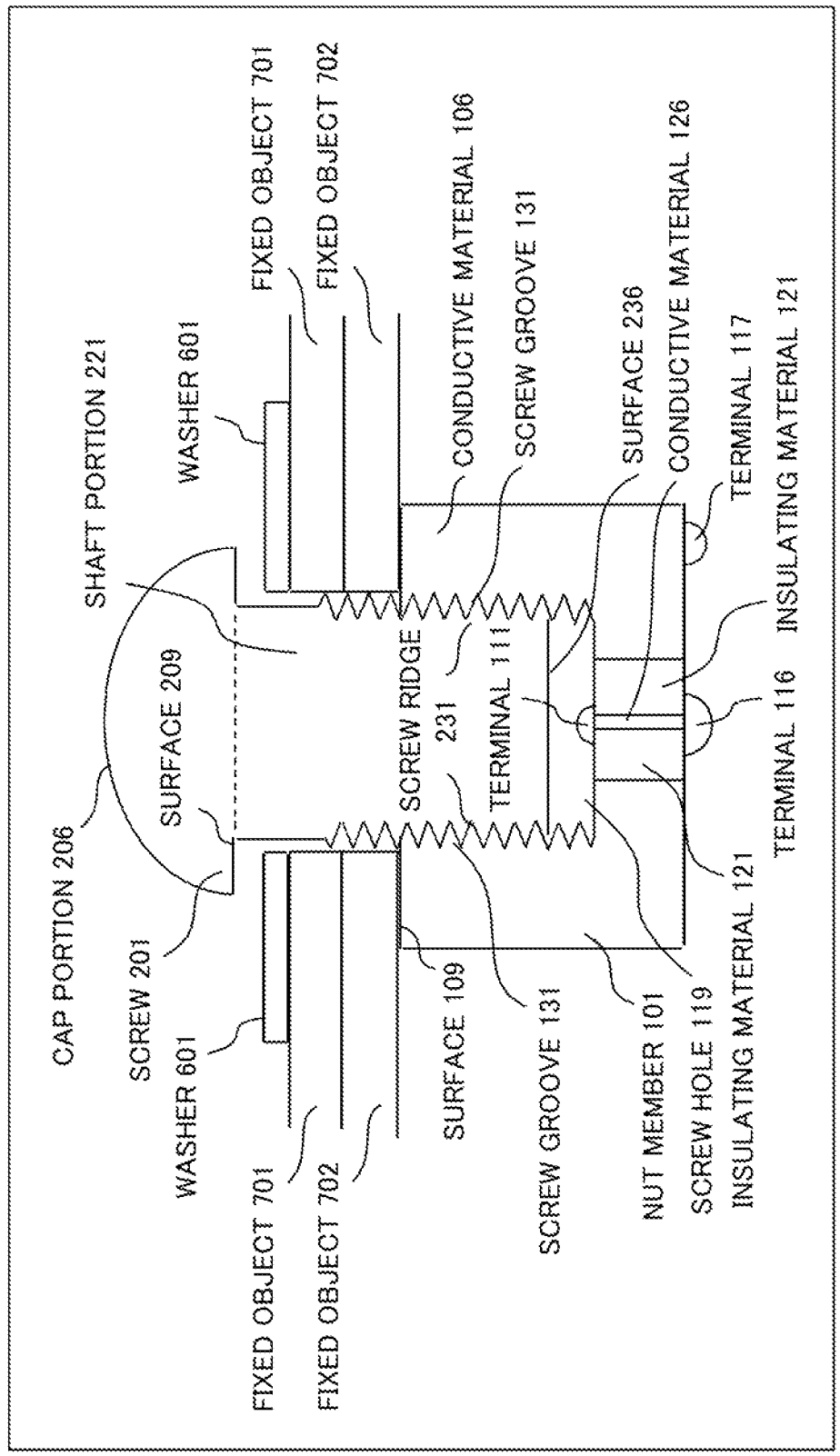
FIG. 6 is a schematic diagram illustrating a state in which engagement of the screw with the nut member is loosened in the structure illustrated in FIG. 5.

FIG. 6 is a schematic diagram illustrating a state in which engagement of the screw 201 with the nut member 101 is loosened in the structure illustrated in FIG. 5. In the state illustrated in FIG. 6, a gap is formed between a lower end of the cap portion 206 and the washer 601. Thus, the fixed object 701 and the fixed object are not fixed with the screw 201, and in a state where rattling may occur.

Further, in the state illustrated in FIG. 6, the terminal 111 does not contact the surface 236 of the screw 201. Thus, the terminal 116 and the terminal 117 are in an electrically insulated state.

In this state, when the terminals 116 and 117 are connected to the measurement unit 506 illustrated in FIG. 1, the measurement unit 506 detects that a resistance between the terminal 116 and the terminal 117 exceeds the above-mentioned threshold value.

Further, the measurement unit 506 causes the output unit 511 to output information indicating looseness of the threading between the screw 201 and the nut member 101, for example.

Advantageous Effects

An engaged member according to the present example embodiment is provided with two terminals. The terminals are electrically connected to each other when an engaging portion of an engaging member is properly engaged with an engaged portion of the engaged member and a distal end part of the engaging portion contacts a terminal formed in a vicinity of an innermost part of the engaged portion. Further, the terminals are electrically insulated from each other when the engagement state is loosened and the distal end part of the engaging portion does not contact the terminal formed in the vicinity of the innermost part.

Further, a detection device according to the present example embodiment determines that an engagement state is normal when a resistance between the terminals is equal to or less than a threshold value. Further, the detection device determines that the engagement state is loosened when a resistance between the terminals exceeds the threshold value.

As described above, the detection device detects whether the engagement state is loosened, based on presence or absence of contact of the distal end part of the engaging portion with the terminal formed in the vicinity of the innermost part. Further, when the distal end part is even only slightly away from the terminal, the terminals are insulated from each other. Thus, the detection device is capable of reducing the likelihood of erroneous detection for looseness of a screw or the like.

Second Example Embodiment

The engaged member of the example embodiment may be a combination of a plurality of members. A second example embodiment is an example embodiment relating to a detection device in which a nut member being a combination of a plurality of members is used in place of the engaged member described in the first example embodiment.

[Configuration and Operation]

An example of the detection device according to the second example embodiment is a detection device 501 illustrated in FIG. 1. Further, an engaged member 100 according to the second example embodiment, which is illustrated in FIG. 1, includes a plurality of members as described below.

Figure 7:
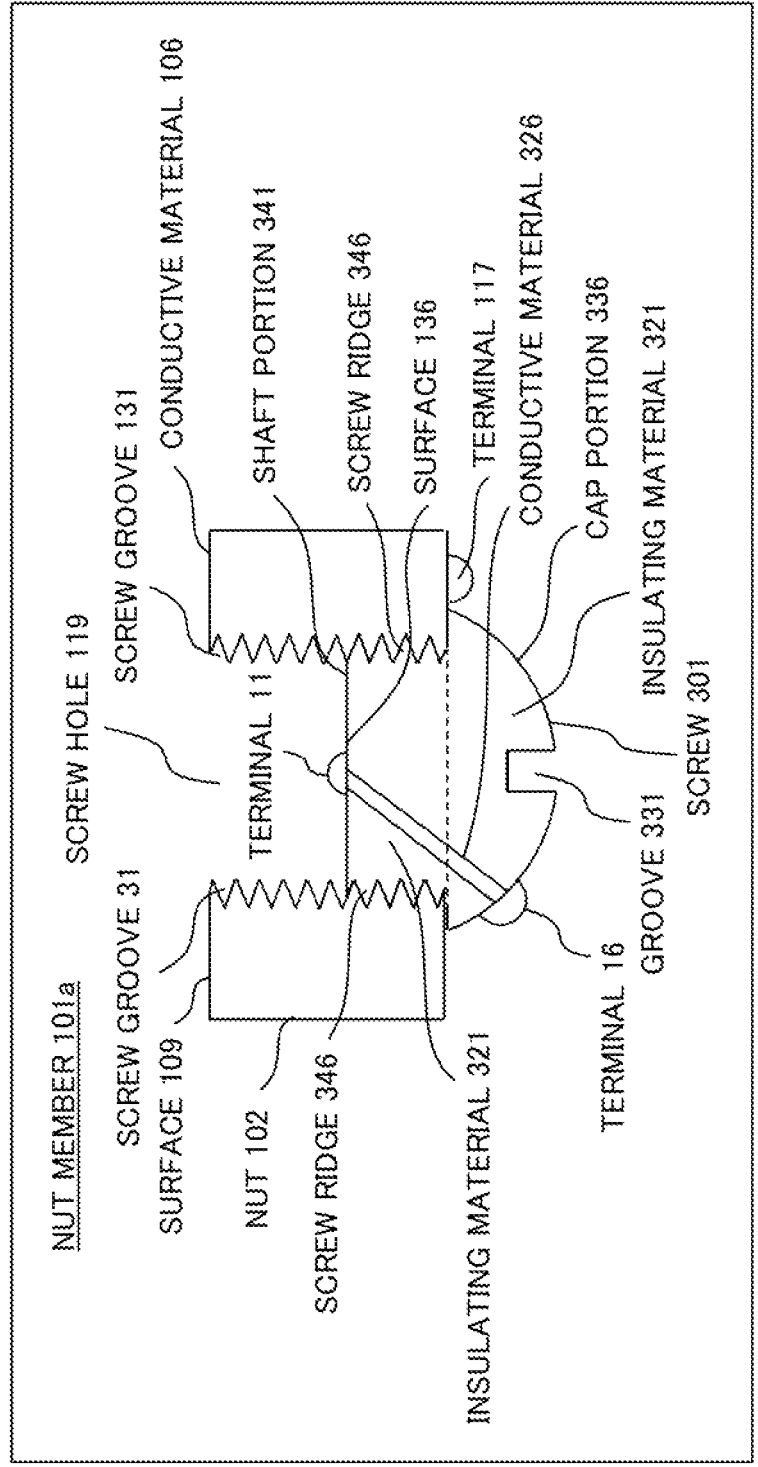
FIG. 7 is a first schematic diagram illustrating a configuration example of an engaged member according to a second example embodiment.
Figure 8:
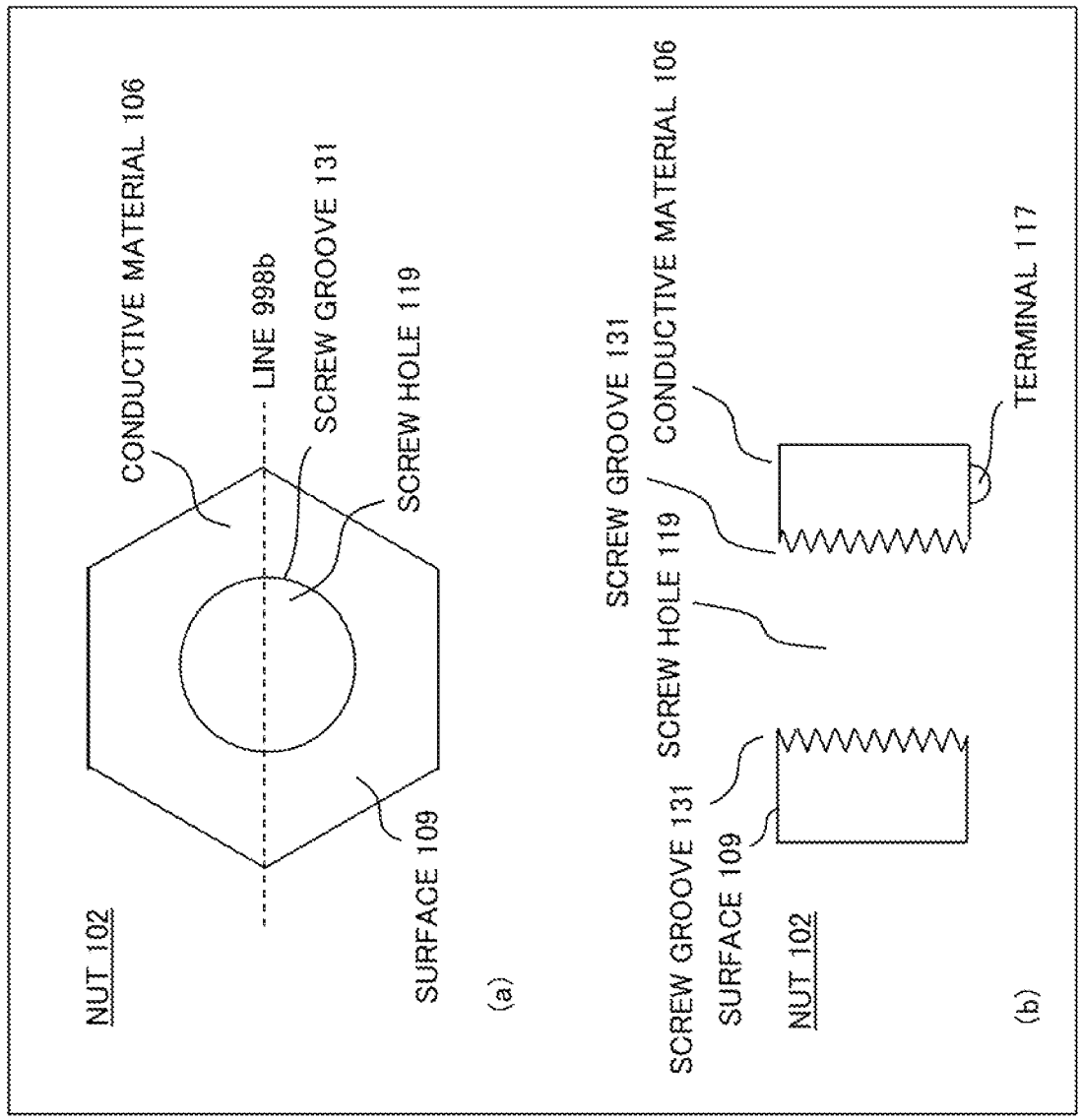
FIG. 8 is a second schematic diagram illustrating a configuration example of the engaged member according to the second example embodiment.
Figure 9:
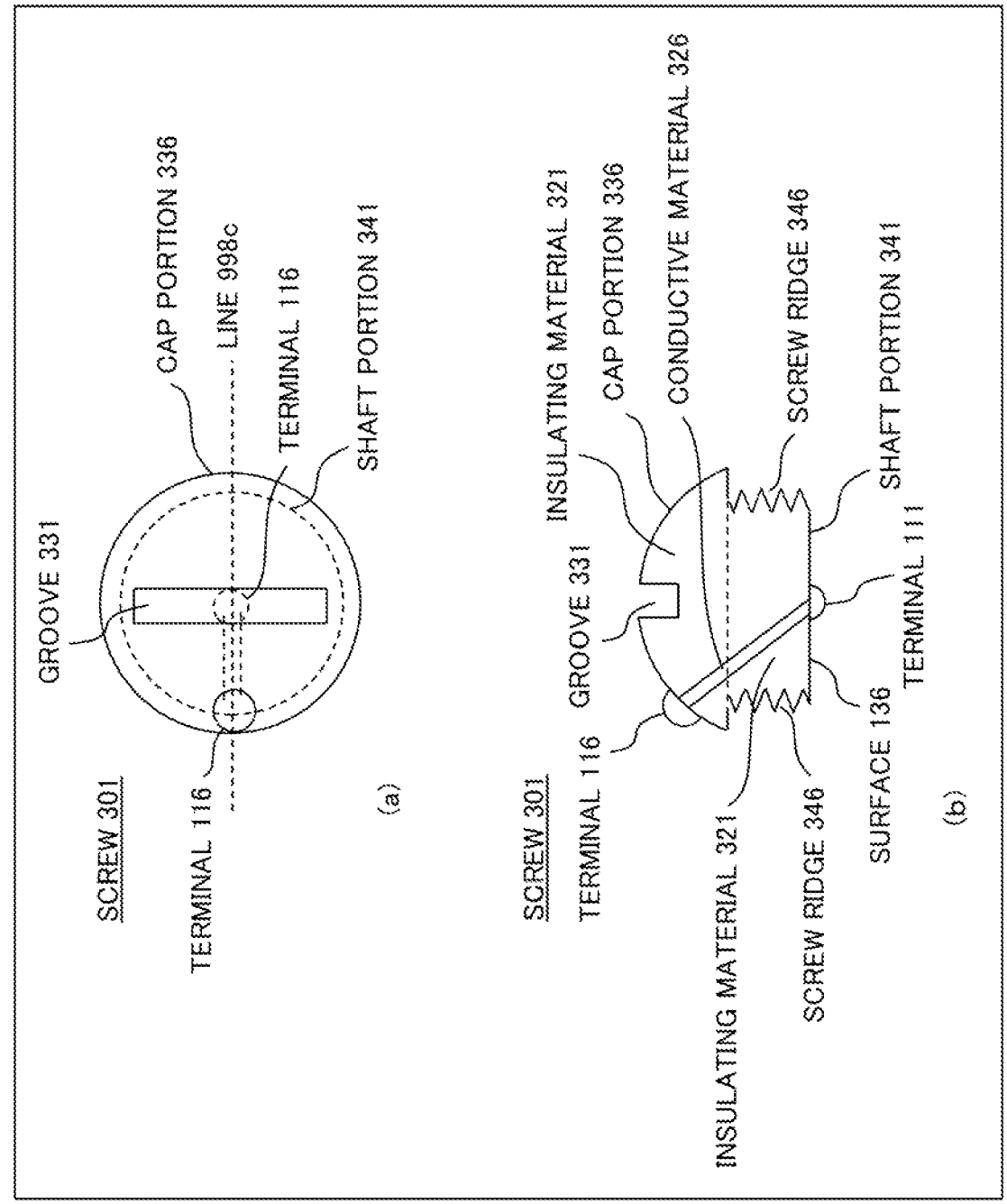
FIG. 9 is a third schematic diagram illustrating a configuration example of the engaged member according to the second example embodiment.

FIGS. 7 to 9 are schematic diagrams each illustrating a configuration of a nut member 101a being an example of the engaged member according to the second example embodiment. FIG. 7 is a cross-sectional diagram illustrating a configuration of the nut member 101a being a combination of a screw 301 and a nut 102. FIG. 8(a) is a top diagram of the nut 102. FIG. 8(b) is a cross-sectional diagram, assuming that the nut 102 is cut along a line 998c illustrated in FIG. 9(a). FIG. 9(a) is a top diagram, assuming that the screw 301 is viewed from a side of a cap portion 336. FIG. 9(b) is a cross-sectional diagram, assuming that the screw 301 is cut along the line 998c illustrated in FIG. 9(a).

As illustrated in FIG. 8, the nut 102 is a hexagonal nut that is formed of a conductive material 106 and is provided with a terminal 117 having conductivity. For example, the conductive material 106 is metal. A screw groove 131 is formed in the conductive material 106 in a periphery of a screw hole of the nut 102. The terminal 117 and the conductive material 106 are electrically connected to each other.

Note that the outline shape of the nut 102 in the top diagram illustrated in FIG. 8(a) is a hexagonal shape, but the outline shape of the nut according to the present example embodiment in the top diagram may be any shape.

As illustrated in FIG. 9, the screw 301 includes a cap portion 336, a shaft portion 341, the terminal 111, and a terminal 116.

The cap portion 336 and the shaft portion 341 are integrally formed, for example. A groove 331 being a groove into which a tip of a screwdriver is inserted is formed on the cap portion 336.

The cap portion 336 and the shaft portion 341 are each formed of a conductive material 326 and an insulating material 321.

The conductive material 326 electrically connects the terminal 111 and the terminal 116 to each other. For example, the conductive material 326 is metal. The terminal 111 and the terminal 116 are also formed of a conductive material such as metal.

As illustrated in FIG. 7, the shaft portion 341 of the screw 301 is engaged with the screw hole 119 of the nut 102. In this state, a screw ridge 346 formed on the shaft portion 341 of the screw 301 is threaded with the screw groove 131 formed in the conductive material 106 of the nut 102.

Figure 10:
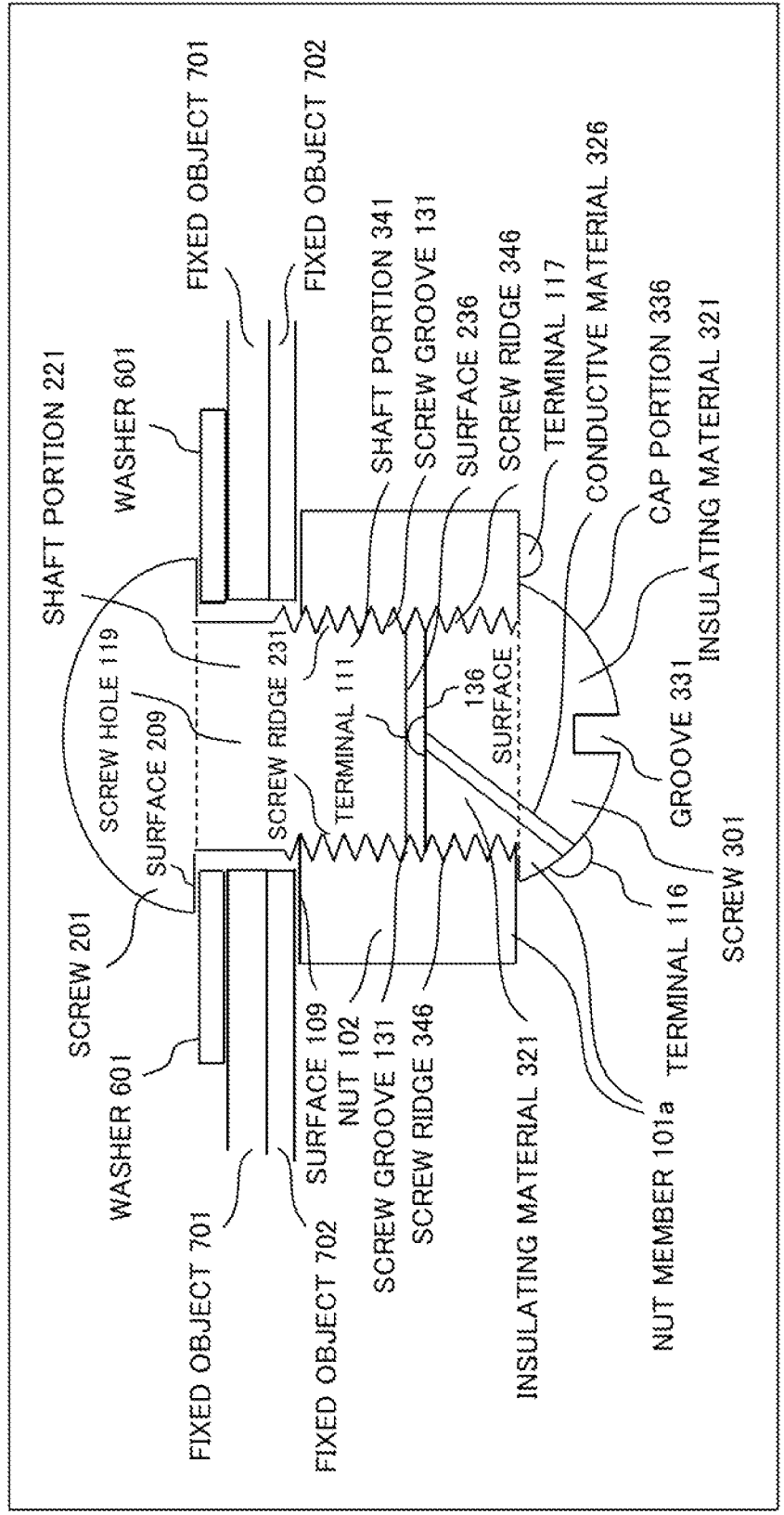
FIG. 10 is a schematic diagram illustrating a state of fixing an object by threading the screw into the nut member.

FIG. 10 is a schematic diagram illustrating a state of fixing an object by threading the screw 201 with the nut member 101a illustrated in FIG. 7. In this case, it is assumed that the screw ridge 231 of the shaft portion of the screw 201 is threaded with the screw groove 131 in the periphery of the screw hole 119 of the nut member 101a.

Fixed objects 701 and 702 illustrated in FIG. 10 are target objects that are fixed to each other through threading between the nut member 101a and the screw 201.

A shaft portion 221 of the screw 201 passes through a hole of a washer 601 and a hole formed in each of the fixed objects 701 and 702, and is threaded with the screw hole 119 of the nut member 101a. Further, the screw 201 fastens the washer 601 and the fixed objects 701 and 702. In this state, a surface 236 of the shaft portion 221 of the screw 201 contacts the terminal 111 of the nut member 101a. In the fastened state, the washer 601 also has a function as an adjustment member for bringing the terminal 111 into contact with the surface 236.

The terminal 111 of the nut member 101a is electrically connected to the surface 236 of the shaft portion 221.

With those structures, the terminal 116 is electrically connected to the terminal 117 through intermediation of the conductive material 326, the terminal 111, the shaft portion 341, and the nut 102.

In the state illustrated in FIG. 10, when the terminals 116 and 117 are connected to a measurement unit 506 illustrated in FIG. 1, the measurement unit 506 detects that a resistance between the terminal 116 and the terminal 117 is equal to or less than a threshold value. The threshold value is a threshold value relating to a resistance value between the terminal 116 and the terminal 117, and is predetermined in order to determine whether or not the surface 136 and the surface 236 contact each other directly, or indirectly through intermediation of another conductor. A resistance between the terminal 116 and the terminal 117 being equal to or less than the threshold value indicates that threading between the screw 201 and the nut member 101a is performed normally.

When the nut 102 illustrated in FIG. 8 and the screw 301 illustrated in FIG. 9 are threaded with each other and the nut member is formed, a spacer may be inserted therebetween.

Figure 11:
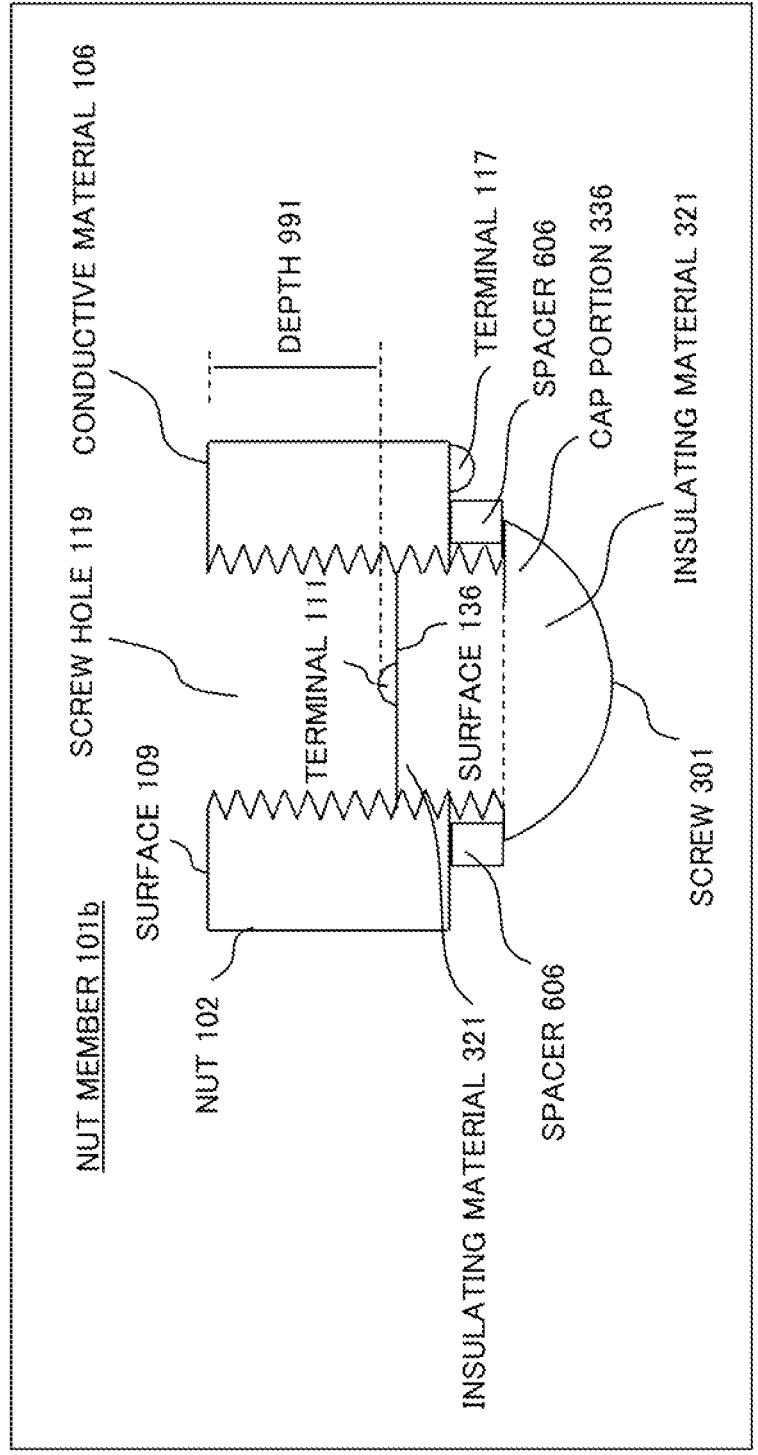
FIG. 11 is a schematic diagram illustrating a configuration example of the nut member in which a nut and the screw are threaded with each other by a spacer inserted therebetween.

FIG. 11 is a schematic diagram illustrating a configuration example of a nut member 101b being an example of a nut member in which a spacer 606 is inserted between the nut 102 and the screw 301, and the nut 102 and the screw 301 are threaded with each other.

The nut 102 illustrated in FIG. 11 is the nut 102 illustrated in FIG. 8.

The screw 301 illustrated in FIG. 11 is the screw 301 illustrated in FIG. 9. In FIG. 11, the groove 331, the terminal 116, and the conductive material 326 that are illustrated in FIG. 9 are omitted in illustration.

In the nut member 101b, a depth 991 illustrated in FIG. 11 can be adjusted by adjusting a thickness of the spacer 606. This indicates that adjustment can be performed to some extent by changing the thickness of the spacer 606 even when a shaft length of a screw that is used, in combination with the nut member 101b, for fixing an object is excessively large or excessively small for the fixation. In this case, in the adjustment, the terminal 111 of the nut member 101b is brought into contact with a surface of the distal end part of a shaft portion of a screw while the fixed object is fixed with the nut member 101b and the screw.

Note that, when the shaft length of the screw that is used, in combination with the nut member 101b, for fixing the object is excessively large for the fixation and the contact, adjustment can also be performed to some extent by changing a thickness of the washer 601 illustrated in FIG. 10.

Figure 12:
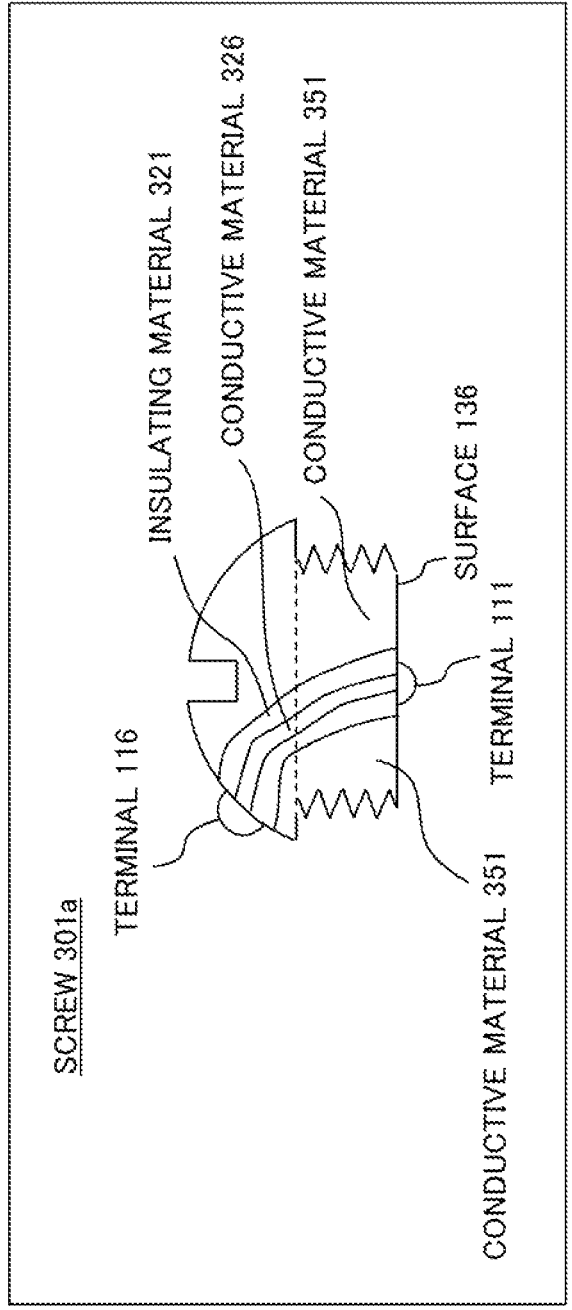
FIG. 12 is a schematic diagram illustrating a configuration of a first variation of a screw 301.

FIG. 12 is a schematic diagram illustrating a configuration of a screw 301a being a first variation of the screw 301 illustrated in FIG. 9.

The screw 301a is mainly formed of a conductive material 351. Typically, the conductive material 351 is metal.

The terminal 111 is electrically connected to the terminal 116 by the conductive material 351. For example, the conductive material 351 is metal.

The insulating material 321 is provided in a periphery of the conductive material 326. A combination of the terminals 111 and 116 and the conductive material 326 is insulated from the conductive material 351 with the insulating material 321.

Figure 13:
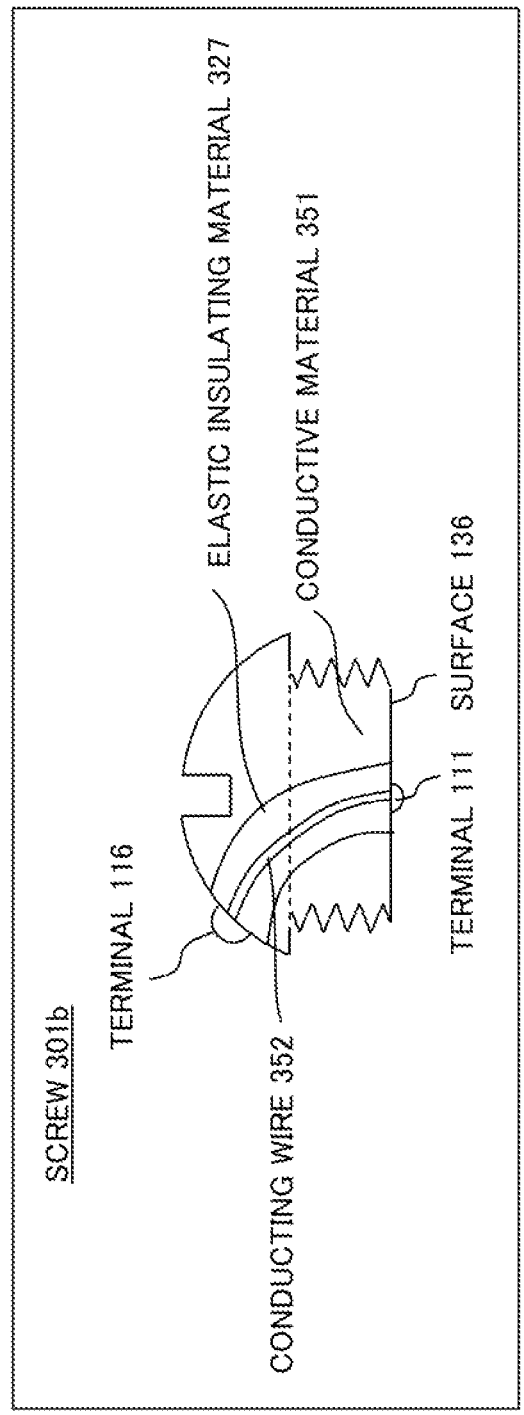
FIG. 13 is a schematic diagram illustrating a configuration of a second variation of the screw 301.

FIG. 13 is a schematic diagram illustrating a configuration of a screw 301b being a variation of the screw 301 illustrated in FIG. 9.

The screw 301b is mainly formed of the conductive material 351. typically, the conductive material 351 is metal.

The terminal 111 is electrically connected to the terminal 116 by a conducting wire 352.

An elastic insulating material 327 is provided in a periphery of the conductive material 351. A combination of the terminals 111 and 116 and the conductive material 351 is insulated from the conductive material 351 with the elastic insulating material 327. For example, the elastic insulating material 327 is rubber.

Figure 14:
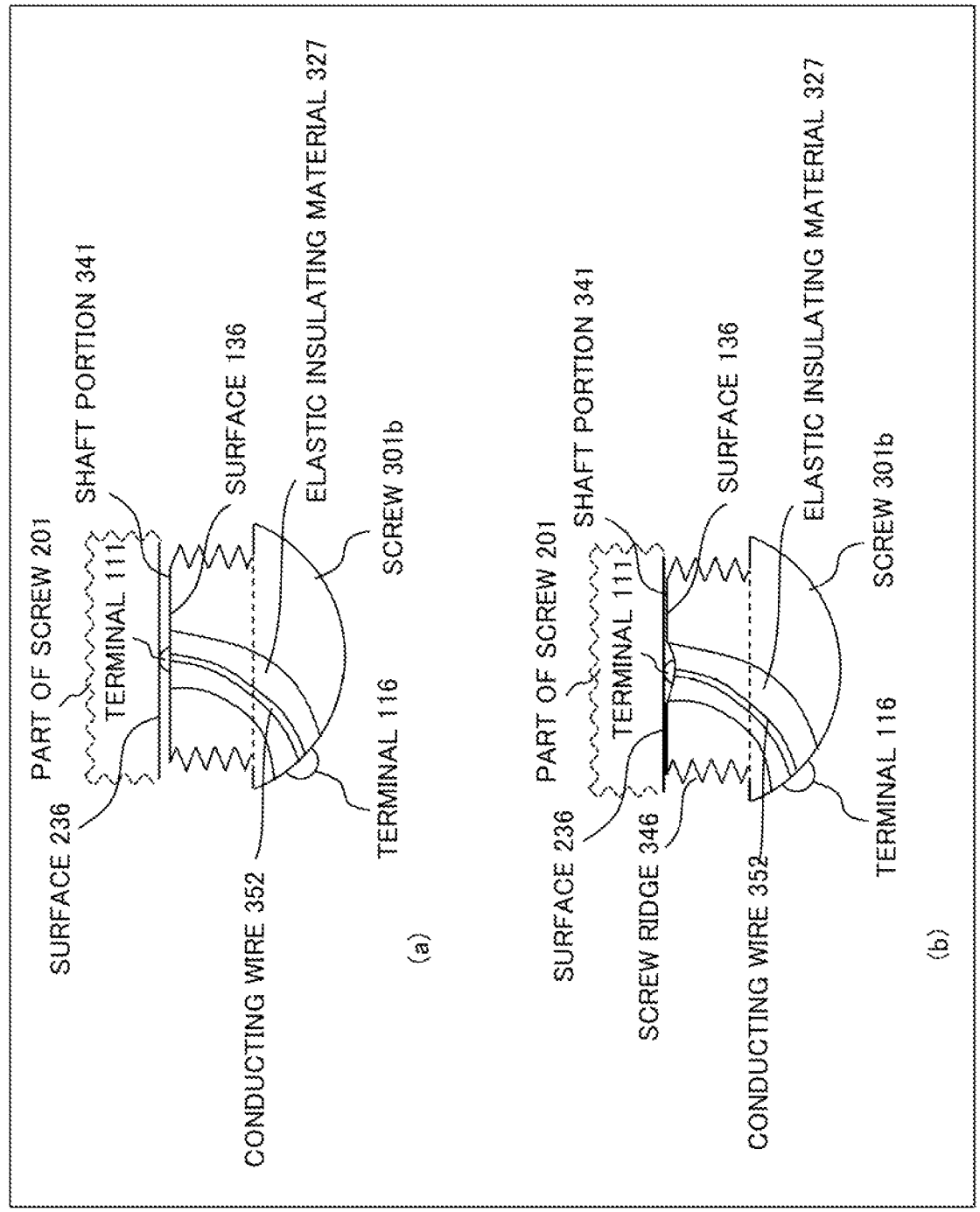
FIG. 14 is an image drawing illustrating a state in a vicinity of a terminal 111 when it is assumed that a screw 301b is used in place of the screw 301 illustrated in FIG. 10.

FIG. 14 is an image drawing illustrating a state in a vicinity of the terminal 111, assuming that the screw 301b illustrated in FIG. 13 is used in place of the screw 301 illustrated in FIG. 10. FIG. 14 illustrates only the screw 301b and the surface 236 of the screw 201 illustrated in FIG. 10, and the other configurations illustrated in FIG. 10 are omitted in illustration.

When insertion of the screw 201 illustrated in FIG. 10 into the nut member 101a progresses, first, as illustrated in FIG. 14(a), the surface 236 contacts an upper end of the terminal 111. At this stage, the elastic insulating material 327 is not deformed.

After that, when insertion of the screw 201 illustrated in FIG. 10 into the nut member 101a progresses, as illustrated in FIG. 14(b), the elastic insulating material 327 is deformed, and the terminal 111 is accommodated below a surface 136. At this occasion, the conducting wire 352 is also flexed more or less, thereby deforming a vicinity of the conducting wire 352 of the elastic insulating material 327. In the state illustrated in FIG. 14(b), the terminal 111 is pressed against the surface 236 of the screw 201 by the elastic insulating material 327.

Contact between the terminal 111 of the screw 301b and the surface 236 of the screw 201 is maintained in the states illustrated in FIG. 14 (a) and FIG. 14 (b) and in a state therebetween. Thus, the screw 301b is capable of maintaining the contact more stably.

The shape and the configuration of the terminal 111 illustrated in FIG. 7 and FIGS. 9 to 14 are not limited to those illustrated in the drawings, and may be any shape and configuration. For example, the terminal 111 may be the terminal 111 illustrated in FIG. 15.

Figure 15:
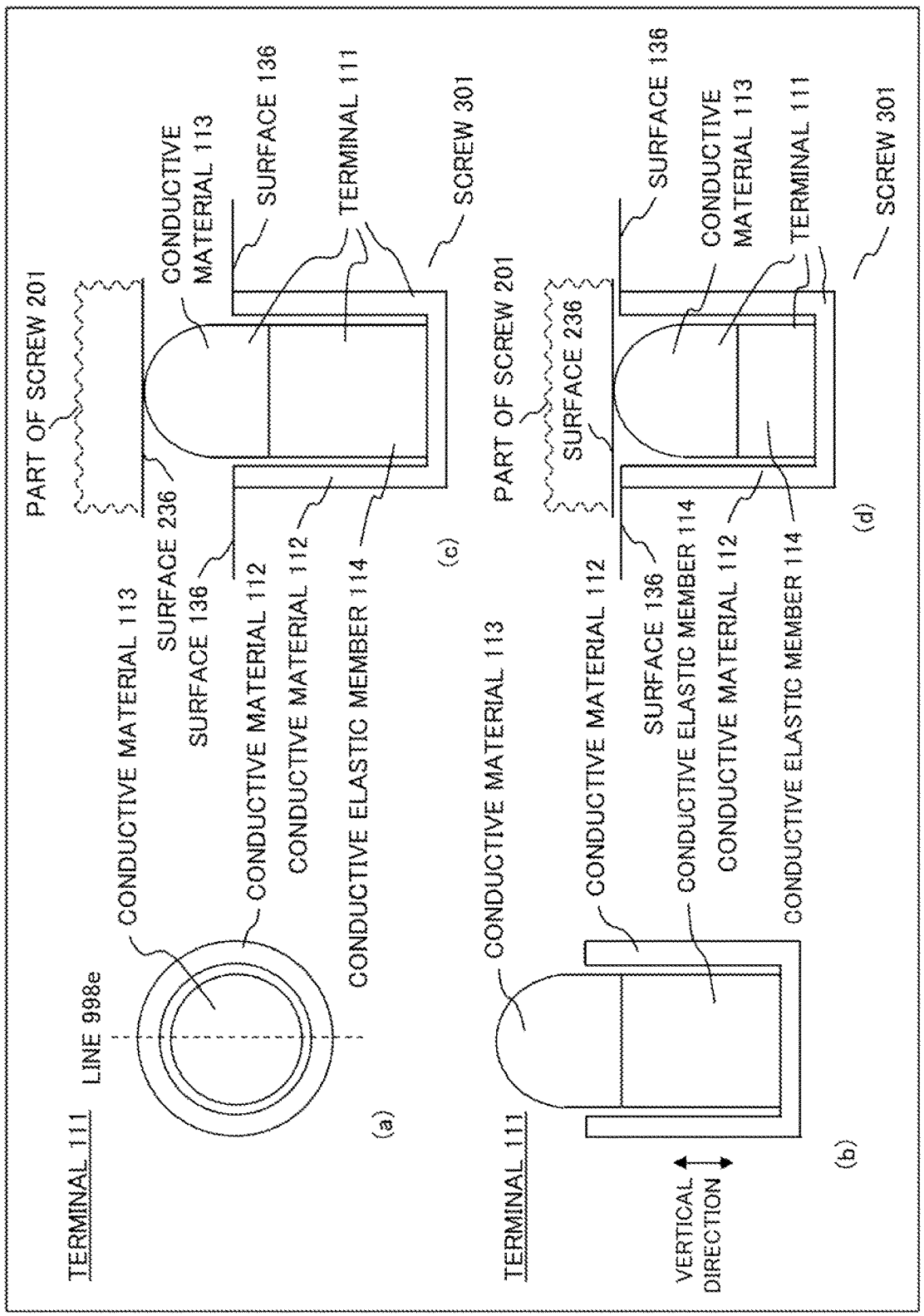
FIG. 15 is a schematic diagram of a configuration example of the terminal 111 and an operation example in the configuration example.

FIG. 15 is a schematic diagram illustrating a configuration example of the terminal 111 and an operation example of the terminal 111 in the configuration example. FIG. 15(a) is a top diagram of the terminal 111. FIG. 15(b) is a cross-sectional diagram, assuming that the terminal 111 is cut along a line 998e illustrated in FIG. 15(a). Further, FIGS. 15(c) 15(d) are image drawings each illustrating a state in the vicinity of the terminal 111, assuming that the terminal 111 illustrated in FIGS. 15(a) and 15(b) is used in place of the terminal 111 of the screw 301 illustrated in FIG. 10. FIGS. 15(c) and 15(d) each illustrate only the screw 301b and the surface 236 of the screw 201 illustrated in FIG. 10, and the other configurations illustrated in FIG. 10 are omitted in illustration.

The terminal 111 includes conductive materials 112 and 113 and a conductive elastic member 114.

For example, the conductive materials 112 and 113 are metal.

The conductive elastic member 114 electrically connects the conductive material 112 and the conductive material 113 to each other.

Further, the conductive elastic member 114 has elasticity in a vertical direction illustrated in FIG. 15(b). A configuration, shape, and material of the conductive elastic member 114 may be any configuration, shape, and material.

For example, the conductive elastic member 114 is a conductive spring or a conductive rubber.

Alternatively, the conductive elastic member 114 may include an insulating elastic member and a deformable electro-conductive material, the insulating elastic member may have elasticity in the vertical direction illustrated in FIG. 15(b), and the electro-conductive material may electrically connect the conductive material 112 and the conductive material 113 to each other.

As illustrated in FIGS. 15(c) and 15(d), for example, the terminal 111 is used in a state of being embedded in the screw 301 also illustrated in FIG. 10, in such a way that a height of an upper end of the conductive material 112 is flush with the surface 136 also illustrated in FIG. 10.

When insertion of the screw 201 illustrated in FIG. 10 into the nut member 101a progresses, first, as illustrated in FIG. 15(c), the surface 236 of the screw 201 contacts an upper end of the terminal 111. At this stage, the conductive elastic member 114 is not deformed.

After that, when insertion of the screw 201 illustrated in FIG. 10 into the nut member 101a progresses, as illustrated in FIG. 15(d), the conductive elastic member 114 is deformed, and the conductive material 113 enters the conductive material 112. In the state illustrated in FIG. 15(d), the terminal 111 is pressed against the surface 236 of the screw 201 by the conductive elastic member 114.

Contact between the terminal 111 of the screw 301b and the surface 236 of the screw 201 is maintained in the states illustrated in FIGS. 15(c) and 15(d) and in a state therebetween. Thus, the screw 301b is capable of maintaining the contact more stably.

Note that the terminal 111 illustrated in FIGS. 15(a) and 15(b) can also be used as the terminal 111 according to the first example embodiment, in which case similar effects are exerted.

Figure 16:
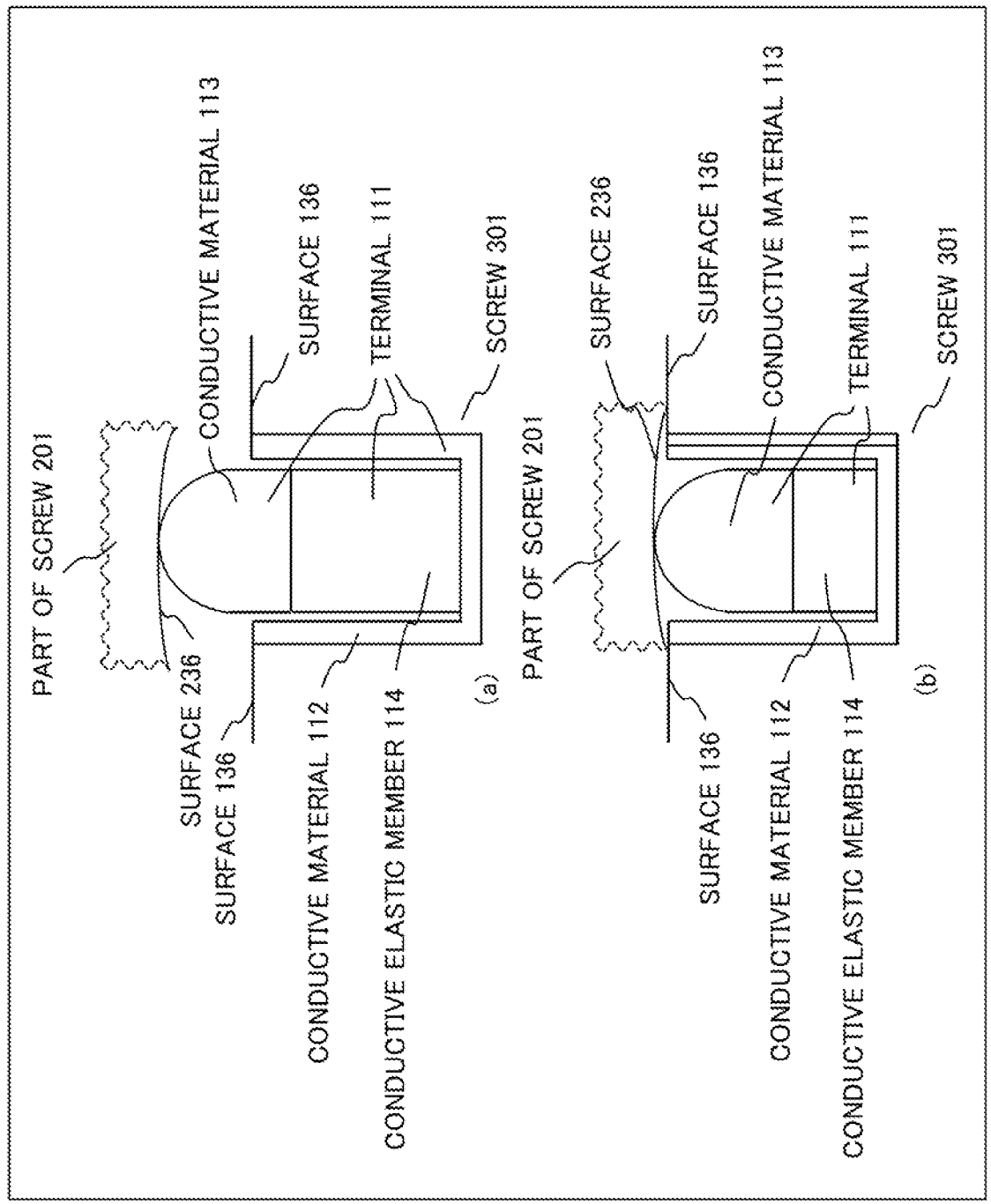
FIG. 16 is a diagram illustrating a surface 236 of a screw 201, which is a recessed surface with respect to the terminal 111.

As illustrated in FIG. 16, the surface 236 of the screw 201 illustrated in FIG. 10 may be a recessed surface with respect to the terminal 111. In such case, a contact position of the surface 236 with the conductive material 113 is less likely to be shifted. Thus, contact between the terminal 111 of the screw 301b and the surface 236 of the screw 201 can be maintained more stably.

As illustrated in FIG. 16, the configuration in which the surface 236 of the screw 201 is a recessed surface with respect to the terminal 111 is applicable to the screw 201 according to the first example embodiment. In this case, effects similar to those described above are exerted.

Advantageous Effects

A detection device according to the second example embodiment has a configuration similar to that of the detection device according to the first example embodiment, and exerts effects similar to those of the detection device according to the first example embodiment.

In addition, an engaged member according to the second example embodiment includes the plurality of members. Thus, the engaged member can be adjusted more easily in such a way as to match a length of a shaft portion of a screw or the like that is used in combination with the engaged member, for example.

Figure 17:
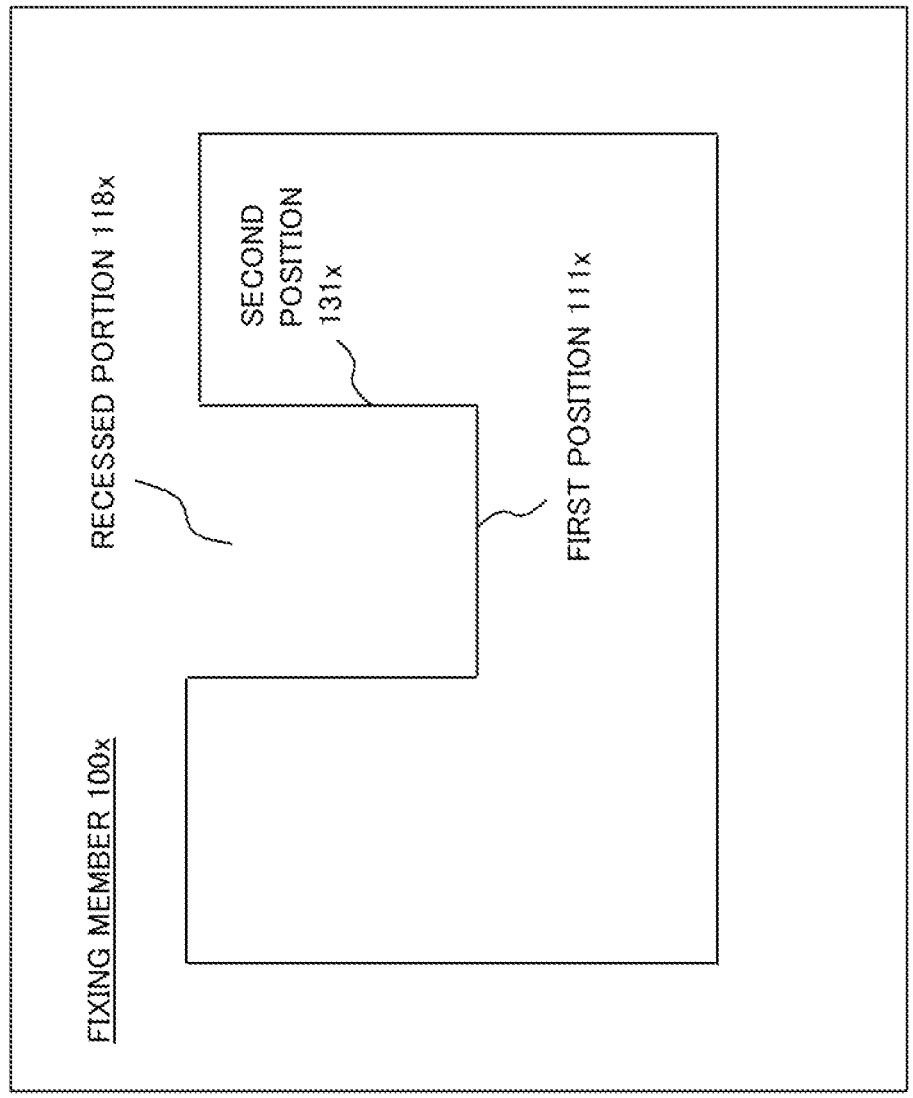
FIG. 17 is an image drawing illustrating a minimum configuration of the engaged member of the example embodiment.

FIG. 17 is an image drawing illustrating a configuration of a fixing member 100x being a minimum configuration example of the member of the example embodiment.

A recessed portion 118x is formed in the fixing member 100x.

The fixing member 100x includes a plurality of conduction paths. A part of each of the plurality of conduction paths is exposed at a plurality of positions including a first position 111x that is in an inside of the recessed portion 118x and is in a vicinity of a innermost part, and a second position 131x that is in the inside and is in a part other than the vicinity of the innermost part, and another part of each of the plurality of conduction paths is exposed to an outside of the recessed portion. Further, a predetermined member that contacts the first position 111x and the second position 131x can press a periphery of an opening part of the recessed portion 118x.

The first position 111x and the second position 131x are insulated from each other, and are electrically connected to the outside of the recessed portion 118x through the conduction paths. Thus, by measuring a resistance value between each of the positions on the outside of the recessed portion 118x, which are electrically connected to each of the first position 111x and the second position 131x, it is possible to determine whether the first position 111x and the second position 131x are electrically connected to each other due to a contact of the vicinity of the distal end of the engaging member, which is engaged with the recessed portion 118x, and the vicinity of the innermost part.

In this case, when the engaging member electrically contacts the first position 111x and the second position 131x to each other, the engagement is properly performed. Further, when the engaging member does not electrically connect the first position 111x and the second position 131x to each other, the engagement is improperly performed.

Therefore, by measuring a resistance value between each of the positions on the outside of the recessed portion 118x, it can be determined whether the engagement is properly performed.

Thus, the fixing member 100x is capable of reducing the likelihood of erroneous detection resulting from improper engagement with the recess 118x of the engaging portion.

Thus, with the above-described configuration, the fixing member 100x exerts the effects described in the section of [Advantageous Effects of Invention].

Note that a shape of the fixing member 100x and the recessed portion 118x is not limited to those illustrated in FIG. 17, and may be any shape.

For example, the fixing member 100x is the member 100 illustrated in FIG. 1, the nut member 101 illustrated in FIGS. 2 to 6, and the nut member 101a illustrated in FIG. 7, FIG. 10, and FIG. 11. Further, for example, the recessed portion 118x is the engaged portion 118 illustrated in FIG. 1, and the screw hole 119 illustrated in FIG. 2, FIGS. 4 to 7, FIG. 10, and FIG. 11. Further, for example, the engaging member is the engaging member 200 illustrated in FIG. 1, and the screw 201 illustrated in FIGS. 3 to 6 and FIG. 10. Further, for example, the engaging portion is the engaging portion 202 illustrated in FIG. 1, and the shaft portion 221 illustrated in FIGS. 3 to 6 and FIG. 10. Further, for example, the first position 111x is in a vicinity of a peak of the terminal 111 illustrated in FIG. 2, FIGS. 4 to 7, and FIGS. 9 to 16. Further, for example, the second position 131x is a position included in a side surface of the engaged portion 118 illustrated in FIG. 1 and in a side surface of the screw hole 119 illustrated in FIG. 2, FIGS. 4 to 8, FIG. 10, and FIG. 11. Further, for example, the another part is the terminal 116 illustrated in FIG. 1, FIG. 2, FIGS. 4 to 7, FIG. 9, FIG. 10, and FIGS. 12 to 14, or the terminal 117 illustrated in FIG. 1, FIG. 2, FIGS. 4 to 8, FIG. 10, and FIG. 11.

The example embodiments of the present invention are described above. However, the present invention is not limited to the example embodiments described above, and further modification, replacement, and adjustment can be made within the basic technical ideas of the present invention. For example, the configurations of the elements illustrated in the drawings are merely examples for easy understanding of the present invention, and the present invention is not limited to those configurations illustrated in the drawings.

Further, a part or the entirety of the example embodiments described above may be described as in the following supplementary notes, but is not limited to the following.

(Supplementary Note 1)

A fixing member, including:

a recessed portion being formed; and a plurality of conduction paths being electrically insulated from each other, and each including:

a part that is exposed at a plurality of positions including a first position in an inside of the recessed portion and in a vicinity of an innermost part and a second position in the inside and in a part other than the vicinity of the innermost part; and another part that is exposed to an outside of the recessed portion, wherein
a predetermined member that contacts the first position and the second position is able to press a periphery of an opening part of the recessed portion.

(Supplementary Note 2)
The fixing member according to Supplementary Note 1, further including
two or more sub members.

(Supplementary Note 3)
The fixing member according to Supplementary Note 1 or 2, wherein
the recessed portion is an engaged portion being able to be engaged with an engaging portion of an engaging member, the engaging portion having a protruding shape, and,
when the engagement is performed, the periphery is able to press an object against a second surface formed on the engaging member.

(Supplementary Note 4)
The fixing member according to Supplementary Note 3, wherein
the first position and the second position are electrically connected to each other when, through the engagement, a vicinity of a distal end of the engaging portion contacts a vicinity of an innermost part of the engaged portion, and
the first position and the second position are not electrically connected to each other when the contact is not performed.

(Supplementary Note 5)
The fixing member according to Supplementary Note 4, wherein
the engaging member is a screw, and
is a nut member having a cap-nut shape, and includes a screw hole provided with a screw ridge threaded with a screw groove of a shaft portion of the screw through the engagement,
the engaging portion is the shaft portion,
the engaged portion is the screw hole, and
the contact is performed between the vicinity of the distal end and the vicinity of the innermost part.

(Supplementary Note 6)
The fixing member according to Supplementary Note 5, further including:
a second screw including:
a second shaft portion including a second screw ridge threaded with the screw groove;
the vicinity of the innermost part; and
the first position; and
a nut including the screw hole being able to be threaded with the second shaft portion.

(Supplementary Note 7)
The fixing member according to Supplementary Note 6, further including
a spacer between the nut and the second screw.

(Supplementary Note 8)
The fixing member according to any one of Supplementary Notes 3 to 7, wherein
the engaging portion is formed of a conductive body.

(Supplementary Note 9)
The fixing member according to any one of Supplementary Notes 1 to 8, wherein
an insulating member is formed between a first conductive body being one of the plurality of conduction paths and a second conductive body being one of the plurality of conduction paths.

(Supplementary Note 10)
The fixing member according to Supplementary Note 9, wherein
the insulating material is an insulating elastic member, and
a part of the first conductive body at which the first position is located is accommodated in the insulating elastic member when the first position is pressed.

(Supplementary Note 11)
The fixing member according to any one of Supplementary Notes 1 to 10, wherein
the first position is included in a conductive terminal having a protruding shape, the conductive terminal being a part of the plurality of conduction paths.

(Supplementary Note 12)
The fixing member according to Supplementary Note 11, wherein
the conductive terminal includes a first conductive member, a second conductive member, and a conductive elastic member,
the first conductive member is electrically connected to the second conductive member by the conductive elastic member,
at least a part of the first conductive member is accommodated, by pressing, in a part surrounded by the second conductive member, and
the first position is provided in the first conductive member.

(Supplementary Note 13)
An engaging member, including:
an engaging portion having a protruding shape and an engaged portion having a recessed shape formed in an engaged member, wherein
the engaging portion is able to be engaged with the engaged portion,
the engaged member includes a first position and a second position, and
the first position and the second position are electrically connected to each other when a vicinity of a distal end of the engaging portion comes in contact with a vicinity of an innermost part of the engaged portion through the engagement, and are not electrically connected to each other when the contact is not performed.

(Supplementary Note 14)
The engaging member according to Supplementary Note 13, wherein
the vicinity of the distal end has such a recessed shape as to surround the first position in a state in which the engagement is performed.

(Supplementary Note 15)
A detection device, including:
a measurement unit that derives a resistance value between the first position and the second position of the fixing member according to any one of Supplementary Notes 1 to 12; and
an output unit that performs predetermined output when the resistance value is within a predetermined range.

(Supplementary Note 16)
A detection method, including:
deriving a resistance value between the first position and the second position of the fixing member according to any one of Supplementary Notes 1 to 12; and
performing predetermined output when the resistance value is within a predetermined range.

(Supplementary Note 17)

A detection program causing a computer to execute:

processing of deriving a resistance value between the first position and the second position of the fixing member according to any one of Supplementary Notes 1 to 12; and processing of performing predetermined output when the resistance value is within a predetermined range.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2018-213606, filed on Nov. 14, 2018, the disclosure of which is incorporated herein in its entirety by reference.

REFERENCE SIGNS LIST

100 Engaged member
100x Fixing member
101, 101a Nut member
102 Nut
106, 112, 113, 326, 351 Conductive material
111, 116, 117 Terminal
111x First position
118x Recessed portion
114 Conductive elastic member
118 Engaged portion
119 Screw hole
121, 321 Insulating material
131 Screw groove
131x Second position
136, 236 Surface
200 Engaging member
201, 301, 301a Screw
202 Engaging portion
206, 336 Cap portion
221 Shaft portion
231, 346 Screw ridge
229, 331 Groove
327 Elastic insulating material
341 Shaft portion
352 Conducting wire
501 Detection device
506 Measurement unit
511 Output unit
601 Washer
606 Spacer
701, 702 Fixed object
991 Depth
998a, 998b, 998c, 998e Line

What is claimed is:

1. A fixing member, comprising:
a recessed portion being formed; and
a plurality of conduction paths electrically insulated from each other, and that each include:
    a first part that is exposed at a plurality of positions including a first position in an inside of the recessed portion and in a vicinity of an innermost, second part and a second position in the inside of the recessed portion and in a third part other than the vicinity of the innermost, second part; and
    a fourth part that is exposed to an outside of the recessed portion, wherein
    a predetermined member that contacts the first position and the second position is able to press a periphery of an opening, fifth part of the recessed portion,
wherein the first position is included in a conductive terminal having a protruding shape, the conductive terminal being part of the plurality of conduction paths,
wherein the conductive terminal includes a first conductive member, a second conductive member, and a conductive elastic member,
the first conductive member is electrically connected to the second conductive member by the conductive elastic member, at least part of the first conductive member is accommodated, by pressing, in a sixth part surrounded by the second conductive member, and
the first position is provided in the first conductive member.

2. A detection device, comprising:
a measurement unit that derives a resistance value between the first position and the second position of the fixing member according to claim 1; and
an output unit that performs predetermined output when the resistance value is within a predetermined range.

3. A detection method, comprising:
deriving a resistance value between the first position and the second position of the fixing member according to claim 1; and
performing predetermined output when the resistance value is within a predetermined range.

4. The fixing member according to claim 1, further comprising two or more sub members.

5. The fixing member according to claim 1,
wherein the recessed portion is an engaged portion being able to be engaged with an engaging portion of an engaging member, the engaging portion having a protruding shape, and, when the engagement is performed, the periphery of the opening is able to press an object against a second surface formed on the engaging member.

6. The fixing member according to claim 5, wherein
the first position and the second position are electrically connected to each other when, through the engagement, a vicinity of a distal end of the engaging portion contacts a vicinity of an innermost part of the engaged portion, and
the first position and the second position are not electrically connected to each other when the contact is not performed.

7. The fixing member according to claim 6,
wherein the engaging member is a screw, and
the recessed portion is a nut member having a cap-nut shape, and includes a screw hole provided with a screw ridge threaded with a screw groove of a shaft portion of the screw through the engagement,
wherein the engaging portion is the shaft portion,
the engaged portion is the screw hole, and
the contact is performed between the vicinity of the distal end and the vicinity of the innermost, second part.

8. The fixing member according to claim 7, wherein
the recessed portion comprises a second screw and a second nut, wherein
the second screw includes a second shaft portion including a second screw ridge,
    wherein the second screw forms the vicinity of the innermost part; and
the second nut includes the screw hole being able to be threaded with the second shaft portion.

9. The fixing member according to claim 8, further comprising:

a spacer between the second nut and the second screw.

10. The fixing member according to claim 1, wherein an insulating member is formed between a first conductive body being one of the plurality of conduction paths and a second conductive body being one of the plurality of conduction paths.

11. The fixing member according to claim 10, wherein the insulating material is an insulating elastic member, and a part of the first conductive body at which the first position is located is accommodated in the insulating elastic member when the first position is pressed.

* * * * *